United States Patent [19]

Inagawa

[11] Patent Number: 5,777,277
[45] Date of Patent: Jul. 7, 1998

[54] PRINTED CIRCUIT BOARD

[75] Inventor: Hideho Inagawa, Yokohama, Japan

[73] Assignee: Canon Kabushiki Kaisha, Tokyo, Japan

[21] Appl. No.: 714,442

[22] Filed: Sep. 16, 1996

[30] Foreign Application Priority Data

Sep. 21, 1995 [JP] Japan ................................ 7-243376
Jan. 9, 1996 [JP] Japan ................................ 8-001395

[51] Int. Cl.⁶ ............................................. H01R 9/09
[52] U.S. Cl. ......................... 174/265; 333/182; 439/507; 361/777; 336/200
[58] Field of Search ............................ 174/261, 260, 174/265, 268, 51, 68.5; 333/181, 182, 184, 185, 172, 295, 296, 297; 361/765, 777, 782, 805; 439/507, 511, 55; 336/200, 65

[56] References Cited

U.S. PATENT DOCUMENTS

| 4,694,572 | 9/1987 | Leber et al. ........................... 29/840 |
| 4,869,671 | 9/1989 | Pressley et al. ........................... 439/55 |
| 4,956,627 | 9/1990 | Pfizenmaier et al. ........................... 336/65 |
| 4,962,585 | 10/1990 | Kobayashi ........................... 29/885 |
| 5,015,972 | 5/1991 | Cygan et al. ........................... 333/32 |
| 5,023,753 | 6/1991 | Abe ........................... 361/782 |
| 5,321,380 | 6/1994 | Godek et al. ........................... 336/232 |

FOREIGN PATENT DOCUMENTS 992523  4/1997  Japan.

*Primary Examiner*—Hyung S. Sough
*Assistant Examiner*—Dhiru R. Patel
*Attorney, Agent, or Firm*—Fitzpatrick, Cella, Harper & Scinto

[57] ABSTRACT

A ground connecting pattern of the printed circuit board is separated by forming a spiral circuit pattern element onto a printed circuit board. The separated ground connecting patterns are electrically connected by an electric part, thereby suppressing radiation noises of the printed circuit board.

12 Claims, 7 Drawing Sheets

PRINTED CIRCUIT BOARD

BACKGROUND OF THE INVENTION

1. Field of the Invention

The invention relates to a printed circuit board for forming an inductor by a circuit pattern.

2. Related Background Art

Hitherto, in a printed circuit board, it is a general way to connect electronic parts by soldering and to install the electronic parts onto the printed circuit board.

In recent years, in a high frequency circuit or the like, a signal circuit is formed by forming an inductor by a spiral pattern or a parallel pattern or by providing a delay time. In recent years, therefore, even on the printed circuit board, for example, when the user wants to attach a high frequency filter or the like to a power supply line to an electronic part such as an IC or the like, a circuit element is formed by a pattern and is used as a component element of the filter for the purpose of reduction in costs.

Figures 7A, 7B:
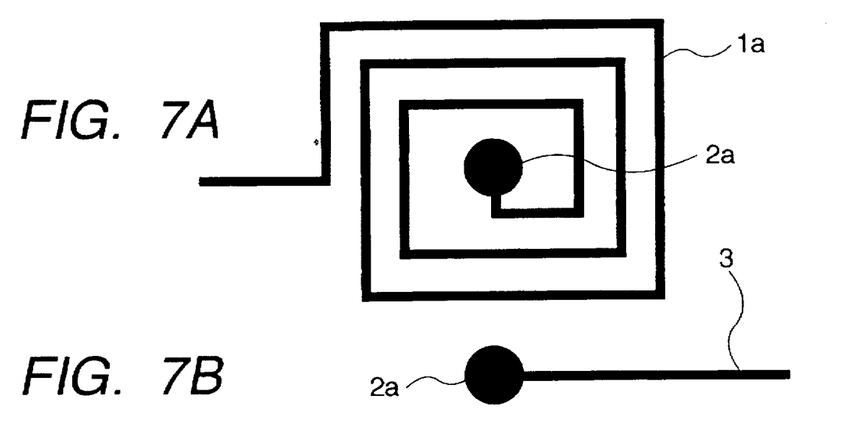
FIG. 7A is a diagram showing a spiral inductance pattern of the first layer of a printed circuit board showing the first conventional example.
FIG. 7B is a diagram showing a lead line corresponding to FIG. 7A.
Figures 8A, 8B:
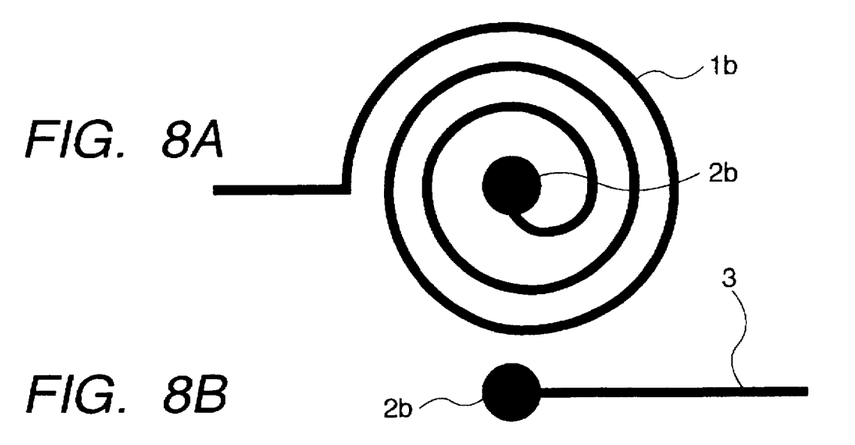
FIG. 8A is a diagram showing a spiral inductance pattern of the first layer of a printed circuit board showing the second conventional example.
FIG. 8B is a diagram showing a lead line corresponding to FIG. 8A.

FIGS. 7A and 7B relate to a first conventional example of a printed circuit board on which an inductor is formed by a circuit pattern and show a spiral inductance pattern of a square type. FIG. 7A shows a pattern of the first layer as a front side of the printed circuit board. FIG. 7B shows a pattern of the second layer as a back side of the printed circuit board. FIGS. 8A and 8B relate to a second conventional example of a printed circuit board on which an inductor is formed by a circuit pattern and show a circular spiral inductance pattern. FIG. 8A shows a pattern of the first layer as a front side of the printed circuit board. FIG. 8B shows a pattern of the second layer as a back side of the printed circuit board.

In the diagrams, reference numerals 1a and 1b denote spiral inductance patterns; 2a and 2b VCC through holes; and 3a and 3b lead lines.

Each of the spiral inductance patterns 1a and 1b of the front surface as a first layer is formed in a square or circular shape and one end at the center is connected to the lead line 3a or 3b of the back surface as a second layer via one VCC through hole 2a or 2b.

However, when a circuit element (hereinafter, referred to as a pattern element) such as an inductor or the like is formed by a pattern onto a power source line as mentioned above, in order to increase a current permission amount, a diameter of through hole or a width of pattern has to be increased. Thus, a ground connecting pattern separated by the power source line is further largely separated by the pattern element. In this instance, there will be no problem if a large solid GND exists in another layer of such a portion and both of the separated ground connecting patterns are connected to the solid GND at a few points by through holes. However, generally, signal wirings and the like are arranged in the other layer and a large solid GND doesn't exist. Therefore, when the pattern element has a large shape, in many cases, the connection between the ground connecting patterns cannot be properly performed.

According to such a structure, as compared with the case where a thick pattern of the GND is connected at the center of the part like, for example, a 3-terminal filter, a connection force of the GND is weak and radiation noises due to it increase and there is a problem such that it is difficult to clear a specific value of an electromagnetic wave trouble.

SUMMARY OF THE INVENTION

It is an object of the invention to solve the above drawbacks and to form a printed inductor without increasing an interval between ground connecting patterns.

Another object of the invention is that a ground connecting pattern separated by a printed inductor is certainly connected without being influenced by another layer, thereby improving radiation noise characteristics.

The above and other objects and features of the present invention will become apparent from the following detailed description and the appended claims with reference to the accompanying drawings.

DETAILED DESCRIPTION OF THE PREFERRED EMBODIMENTS

Embodiments of the invention will now be described hereinbelow with reference to the drawings.

Figure 1A:
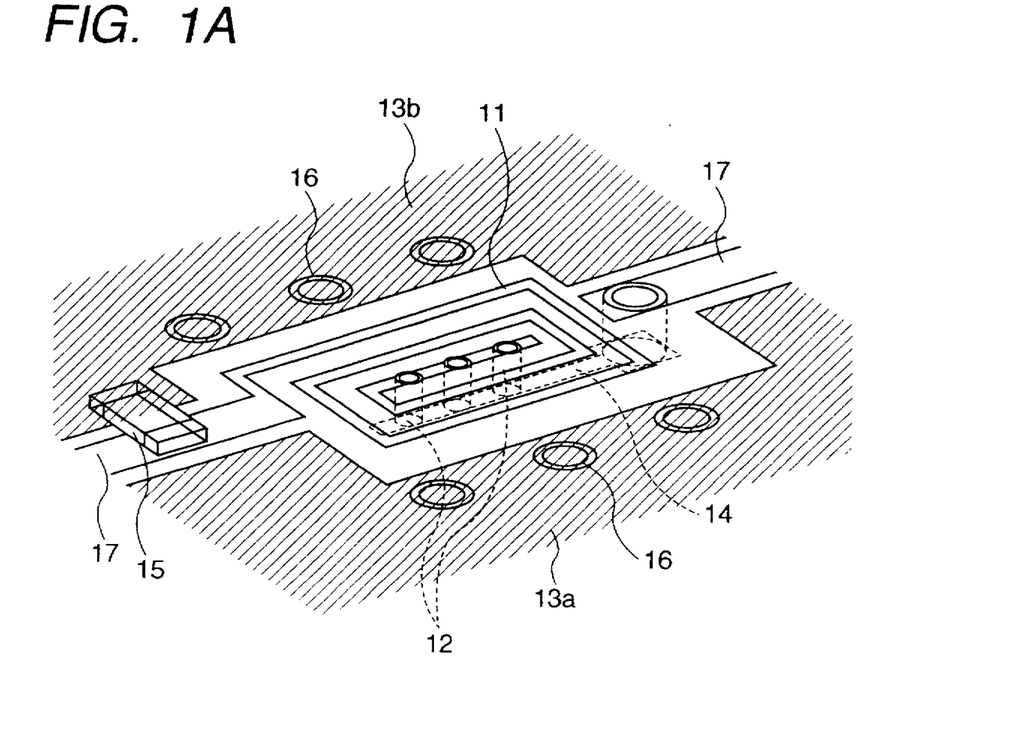
FIG. 1A is a schematic perspective view of a printed circuit board on which an inductor is formed according to the first embodiment of the invention.
Figure 1B:
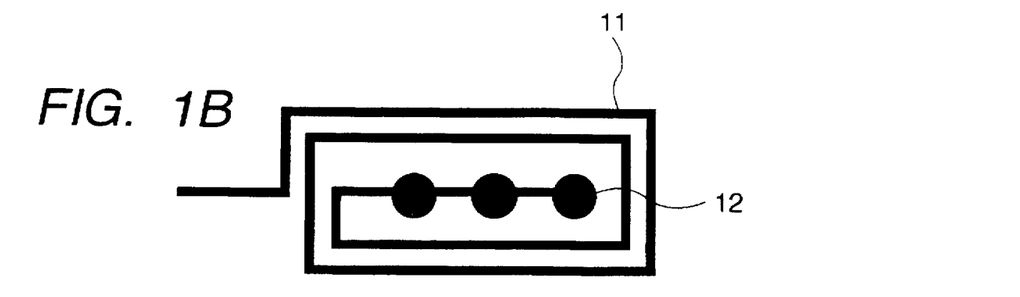
FIG. 1B is a diagram showing a spiral inductance pattern of the first layer of the printed circuit board shown in Fig. 1A.
Figure 1C:
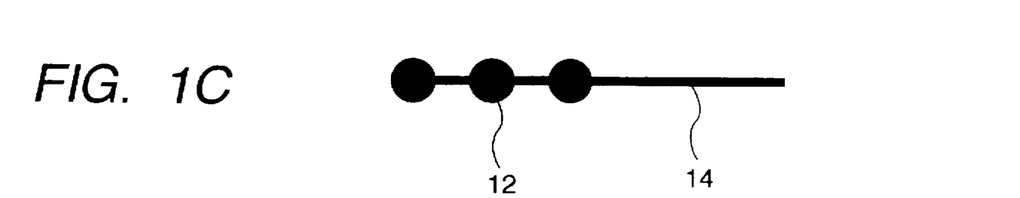
FIG. 1C is a diagram showing a lead line of the second layer of the printed circuit board shown in FIG. 1A.

FIGS. 1A to 1D show the first embodiment and are diagrams showing a state in which a spiral inductance pattern is formed on a printed circuit board. FIG. 1A is a schematic perspective view near a filter when the filter is formed on the printed circuit board by using a spiral inductance pattern. FIG. 1B is a schematic plan view of the first layer as a front side of the printed circuit board on which the spiral inductance pattern is formed. FIG. 1C is a schematic plan view of the second layer as a back side of the printed circuit board. In the diagrams, reference numeral 11 denotes a spiral inductance pattern; 12a and 12b through holes; 13a and 13b ground connecting patterns; 14 a lead line; 15 a chip capacitor; 16 GND through holes provided so as to face the pattern 11; and 17 a power source line.

The spiral inductance pattern 11 is formed on the power source line 17 of a first layer 10a of the printed circuit board. A terminal of a center portion of the pattern 11 is connected to the lead line 14 of a second layer 10b by the plurality of through holes 12b. On the other hand, the chip capacitor 15 is installed near the spiral inductance pattern 11. An LC filter is formed by a combination of those elements.

Although the spiral inductance pattern 11 is formed by an almost square line in the conventional board, it is formed by an almost rectangular line having a major side in the direction of the power source line 17 in the invention.

Therefore, since the spiral inductance pattern 11 is laterally long and an interval to be separated is small, the ground connecting patterns 13a and 13b which are separated by the power source line 17 and spiral inductance pattern 11 are easily connected to a solid ground connecting pattern 18 of the second layer 10b of the back side through the GND through holes 16.

Figure 1D:
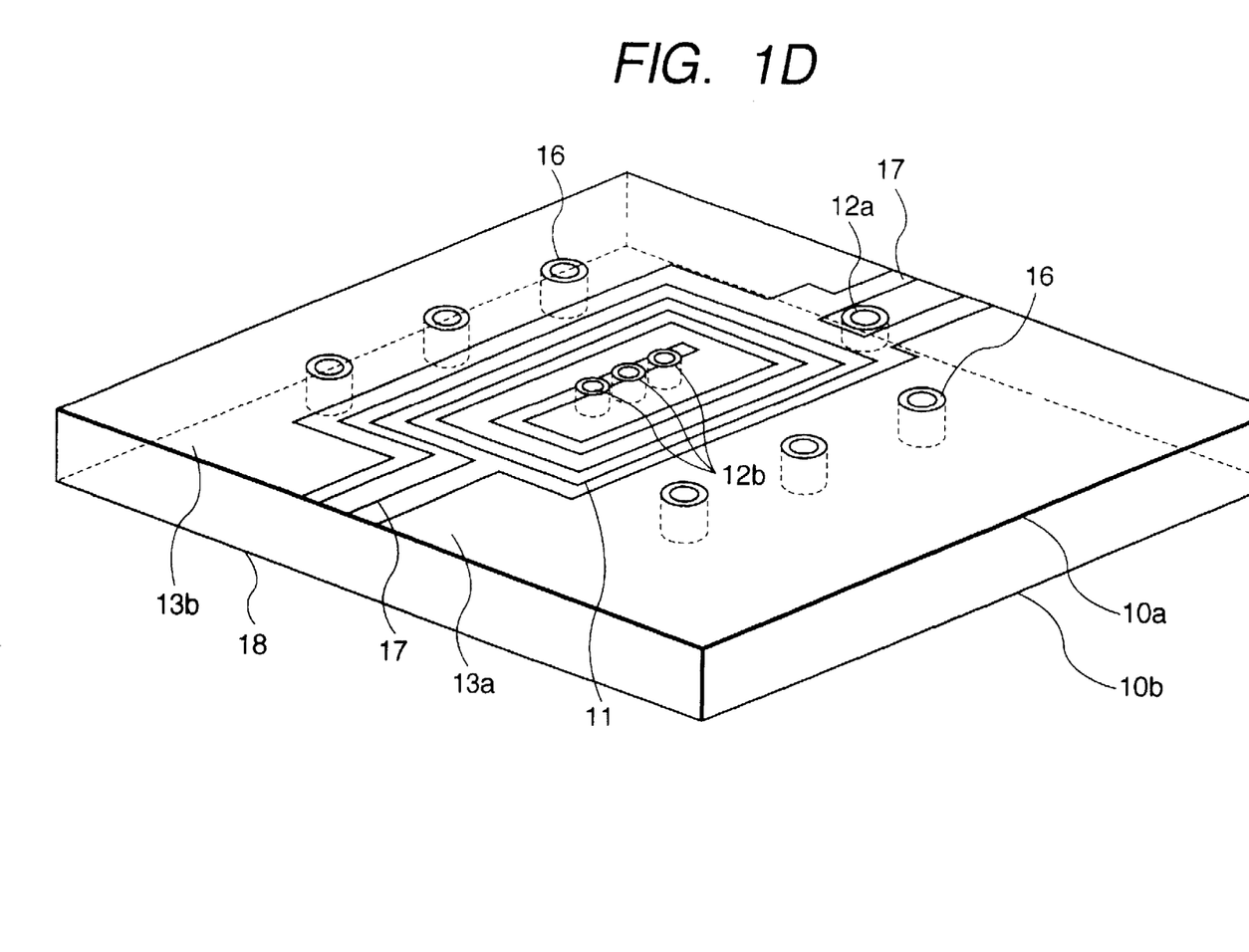
Fig. 1D is a constructional diagram of the printed circuit board shown in FIG. 1A.

Such a printed circuit board is as shown in FIG. 1D.

Namely, the spiral inductance pattern 11 is formed on the power source line 17 of the first layer 10a. The connection between the pattern 11 and power source line 17 is performed via the through hole 12a on the power source line 17 by cutting and returning to the second layer 10b. The ground connecting patterns 13a and 13b of the first layer 10a are separated by the power source line 17 and pattern 11.

The solid ground connecting pattern 18 is formed in the portion of the second layer 10b corresponding to the portion formed with the pattern 11. In order to connect the separated ground connecting patterns 13a and 13b of the first layer 10a, the ground connecting patterns 13a and 13b of the first layer 10a and the ground connecting pattern 18 of the second layer 10b are connected by the through holes 16. Thus, the separated ground connecting patterns 13a and 13b are connected through the ground connecting pattern 18 of the second layer 10b.

Since the line in the power source line direction of the spiral inductance pattern 11 is formed long, the terminal of the center portion can be also connected to the lead line 14 that is parallel with the power source line provided on the second layer by a plurality of VCC through holes 12a and 12b arranged in a line. Thus, a current capacitance from the power source line can be also increased and a short-circuit by a heat or a shock can be also prevented.

Figure 2A:
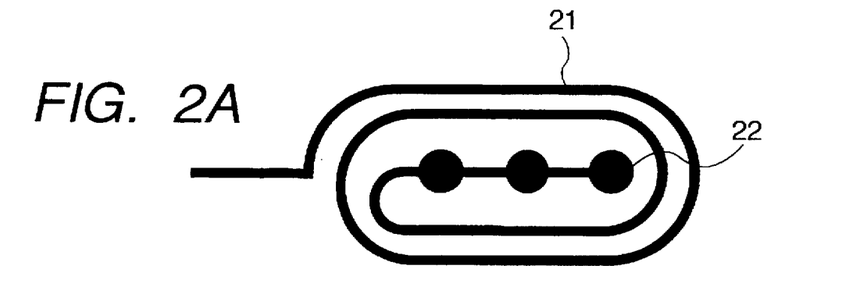
FIG. 2A is a diagram showing another example according to the spiral inductance pattern of the first layer of the printed circuit board shown in FIG. 1A.
Figure 2B:
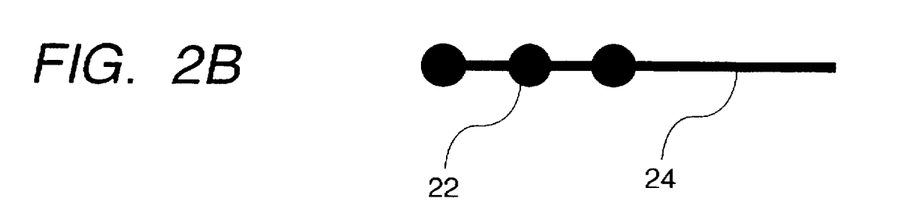
FIG. 2B is a diagram showing a lead line of the second layer of the printed circuit board shown in FIG. 2A.

FIGS. 2A and 2B are diagrams showing another example of the spiral inductance pattern shown in FIGS. 1A to 1D. FIG. 2A is a schematic plan view of the first layer on which a spiral inductance pattern is formed. FIG. 2B is a schematic plan view of the second layer. In the diagrams, reference numeral 21 denotes a spiral inductance pattern; 22 VCC through holes; and 24 a lead line.

In such another example, the straight line of the minor side of the spiral inductance pattern 21 which is provided for the first layer and has an almost rectangular shape in the first example is formed as a semicircular line and is connected to a straight line of the major side. In this case as well, as for the through hole 22 which is connected to the lead line of the second layer and is used for cutting and returning, a plurality of through holes are arranged in the major side direction.

Figure 3A:
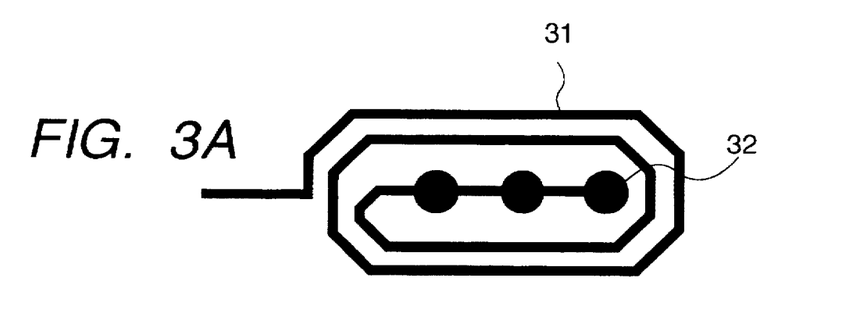
FIG. 3A is a diagram showing still another example according to the spiral inductance pattern of the first layer of the printed circuit board shown in FIG. 1A.
Figure 3B:
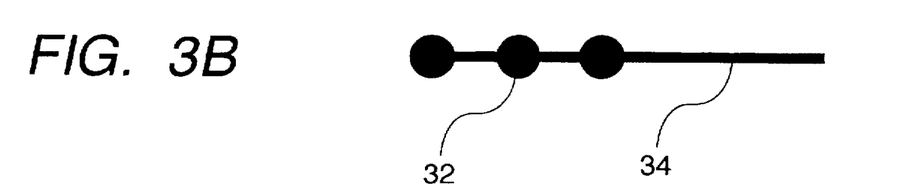
FIG. 3B is a diagram showing a lead line corresponding to FIG. 3A.

FIGS. 3A and 3B are diagrams showing still another example of the spiral inductance pattern shown in FIGS. 1A to 1D. FIG. 3A is a schematic plan view of the first layer on which a spiral inductance pattern is formed. FIG. 3B is a schematic plan view of the second layer. In the diagrams, reference numeral 31 denotes a spiral inductance pattern; 32 VCC through holes; and 34 a lead line.

In such still another example, intersecting portions of the major side and the minor side of the spiral inductance pattern 31 which is provided for the first layer and has an almost rectangular shape in the first example are connected by oblique straight lines, thereby constructing a spiral having an almost long octagonal shape. In this case as well, as for the through holes 32 which are connected to the lead line of the second layer and are used for cutting and returning, a plurality of through holes are formed in the major side direction.

Although the spiral inductance pattern has been formed by the almost square line in the conventional board, according to the first embodiment of the invention as described above, the spiral inductance pattern has a spiral shape with a structure such that an almost rectangular shape having the major side in the direction of the power source line, a structure such that the minor side is semicircular and the major side is a straight line, a structure of an almost long octagonal shape such that the intersecting portions of the minor side and the major side are connected by the oblique straight lines. A width of spiral pattern in the direction in which it perpendicularly crosses the power source line is narrow.

Therefore, as a GND pattern separated by the power source line or spiral inductance pattern, since the interval to be separated by the spiral inductance pattern is small, the GND pattern is easily connected to the solid GND pattern of another layer through the GND through holes. There is, consequently, an effect such that it is possible to eliminate a fear such that the GND pattern near the pattern element inserted on the power source line in order to suppress the radiation noises from, for example, the printed circuit board is separated by such a pattern element and, contrarily, the radiation noise characteristics deteriorate.

Since the line in the direction of the power source line of the spiral inductance pattern is formed long, the terminal of the center portion can be also connected to the lead line that is parallel with the power source line provided for another layer by a plurality of VCC through holes arranged in a line, there are effects such that the current capacitance from the power source line can be also increased and a short-circuit by a heat or a shock can be also prevented.

The pattern element, consequently, can be used as a noise eliminating filter without any problem and a large effect of the reduction of costs that can be expected as compared with the case where expensive filter parts are used. By using such a shape which is vertically (laterally) long, the pattern element can be also used in a confused portion like a bus line.

Figure 4:
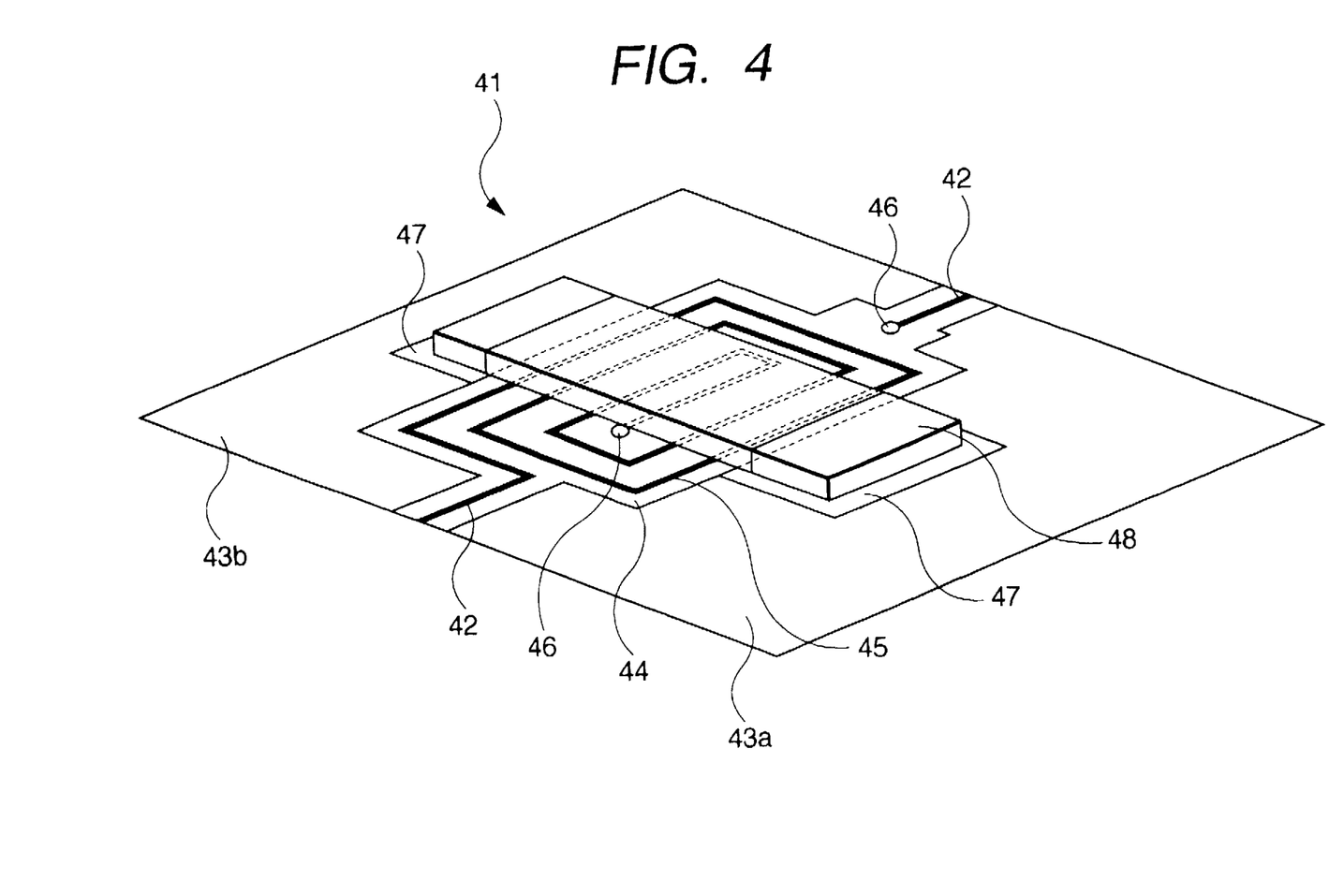
FIG. 4 is a schematic perspective view of a printed circuit board on which an inductor is formed according to the second embodiment of the invention.

The second embodiment of the invention will now be described with reference to FIG. 4. FIG. 4 shows a printed circuit board having a spiral inductance pattern.

In FIG. 4, a spiral pattern element inductor 45 is formed as a circuit element pattern onto a power source line 42 to electronic parts (not shown) of a printed circuit board 41. Ground connecting patterns 43a and 43b are separated by the power source line 42 and pattern element inductor 45. As for the connection between the pattern element inductor 45 and power source line 41, the cutting and returning are performed to another layer (not shown) by through holes 46 on the power source line 42.

Part attaching lands 47 in a state in which a solder resist 44 is eliminated are provided at positions of the separated ground connecting patterns 43a and 43b near the pattern element inductor 45, respectively. A chip jumper 48 serving as an electrical connecting means of a surface installing type is installed on the part attaching lands 47 so as to stride over the pattern element inductor 45.

Thus, the separated ground connecting patterns 43a and 43b are certainly connected by the chip jumper 48 without being influenced by the pattern of the other layer. The radiation noises of the printed circuit board 41 are suppressed. Thus, the pattern element inductor 45 can be used as a noise eliminating filter without any problem. A large reduction of the costs can be expected as compared with the case where expensive filter parts are used. Although the example in which the ground connecting patterns 43a and 43b are connected by the chip jumper 48 has been shown here, the invention is not limited to such an example but a chip resistor of the surface installing type can be also used.

Figure 5:
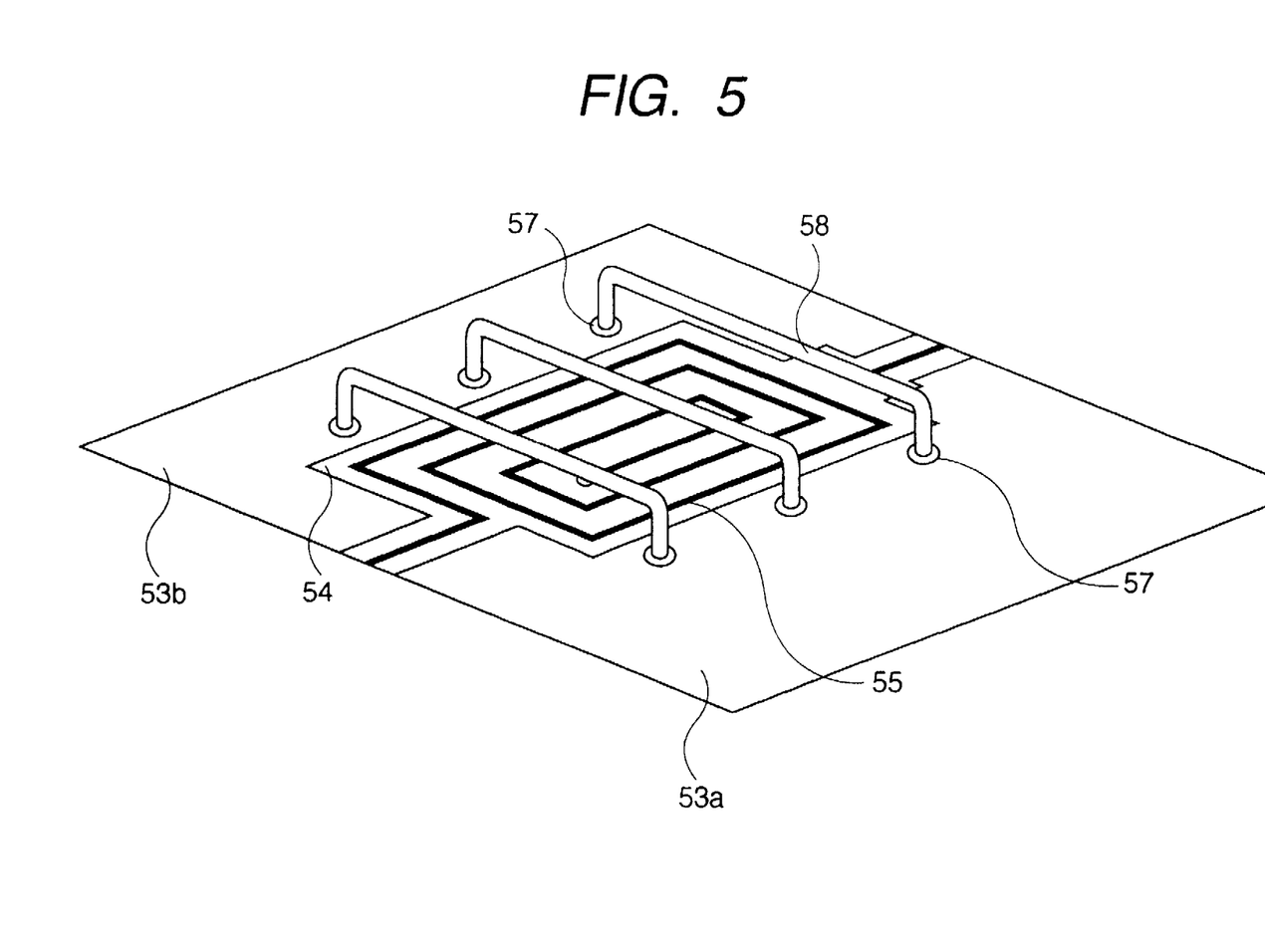
FIG. 5 is a diagram showing another example of the printed circuit board shown in FIG. 4.

FIG. 5 shows another example of the printed circuit pattern shown in FIG. 4. In FIG. 5, through holes 57 are provided at positions of separated ground connecting patterns 53a and 53b near a pattern element inductor 55. The through hole 57 is formed by removing a solder resist 54. A lead line 58 is inserted and installed into the through holes 57 so as to stride over the pattern element inductor 55, so that the separated ground connecting patterns 53a and 53b are connected. Although the example in which the ground connecting patterns 53a and 53b are connected by the lead line 58 has been shown here, the invention is not limited to such an example but a resistor with a lead of the inserting part type can be also used.

Figure 6:
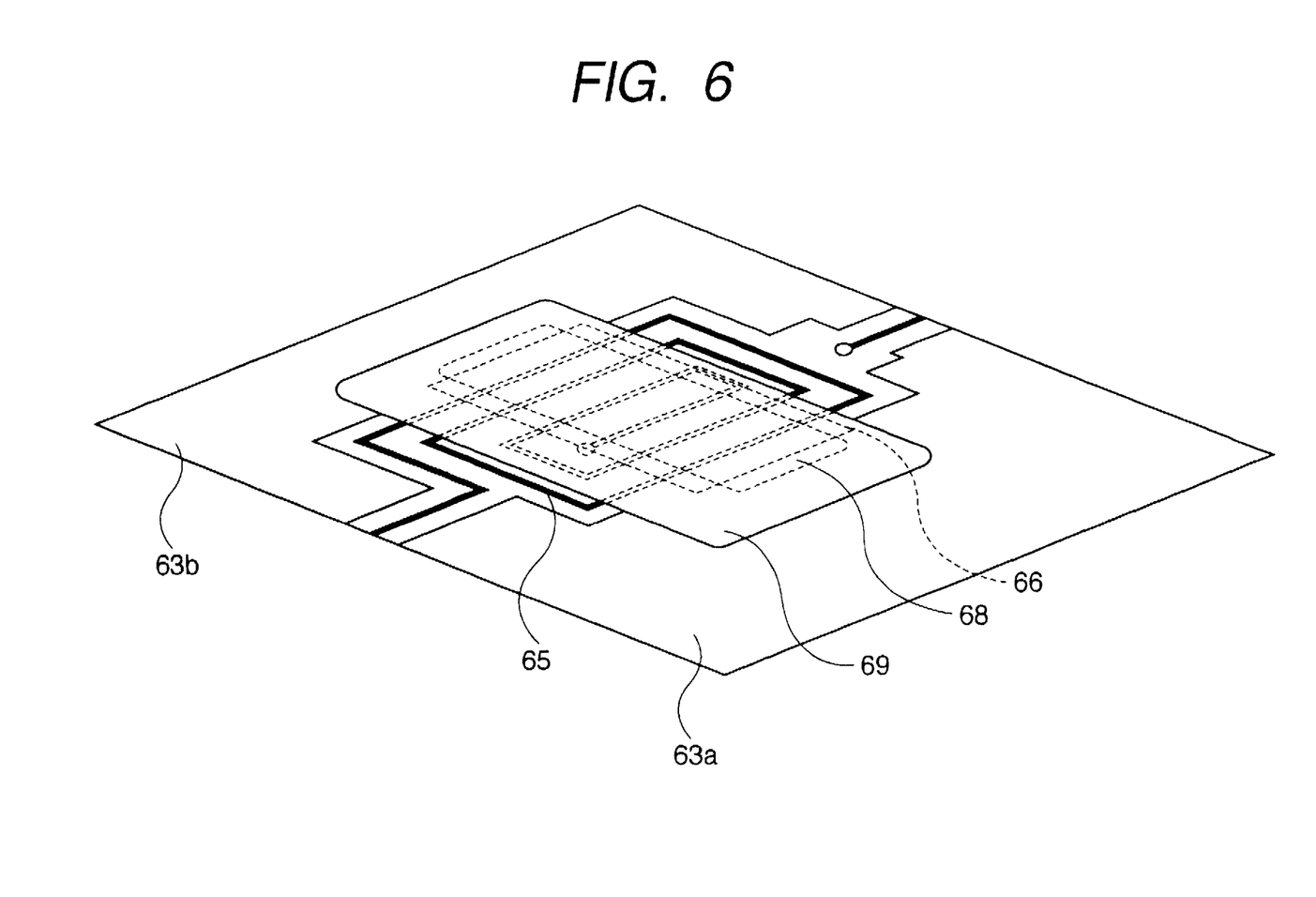
FIG. 6 is a diagram showing still another example of the printed circuit board shown in FIG. 4.

FIG. 6 shows still another example of the printed circuit pattern shown in FIG. 4. In FIG. 6, a conductor film 68 is formed on a pattern element inductor 65 so as to connect separated ground connecting patterns 63a and 63b. Thus, the separated ground connecting patterns 63a and 63b are connected through the conductor film 68. An undercoating resist 66 and an overcoating resist 69 are coated onto the conductor film 68 for the purpose of protection and insulation of the conductor film 68.

For example, the conductor film 68 is formed by a material obtained by mixing a conductive material into a resin base. In a state in which the base is fused like a paste, it is coated by a screen printing, a dispenser, or the like and the base is hardened after that, thereby forming such a film. When using a thermosetting resin as a base, after it was coated, by hardening the base by using a heat which is applied in a step of soldering parts (not shown) onto the printed circuit board, the conductor film 68 can be formed simultaneously with the soldering of the parts. When the light hardening resin is used as a base, after it was coated, the resin is hardened by using a light energy such as an ultraviolet ray or the like which is applied in a step of hardening an adhesive agent to fix parts to be installed onto the printed circuit board, so that the conductor film 68 can be formed.

Although each of the above embodiments has been shown and described with respect to the case where the inductor is formed as a circuit element pattern, the invention is not limited to the inductor but a similar effect is also obtained when a capacitor element of a comb-shaped pattern is used.

According to the second embodiment of the invention as described above, since the ground connecting patterns separated by the circuit element pattern formed on the printed circuit board are connected by the electrical connecting means on both sides of the circuit element pattern, the separated ground connecting patterns can be certainly connected. The radiation noises of the printed circuit board can be suppressed. Moreover, since an electric part which is generally used or a conductor film can be used as electrical connecting means, a construction can be simplified.

What is claimed is:

1. A printed circuit board comprising:

a power source line which is formed on a first layer of the circuit board;

a spiral circuit pattern element which is formed between one end and the other end of said power source line on the first layer of the circuit board, an inner side edge portion of said spiral circuit pattern element being discontinuous to said one end of said power source line and an outer side edge portion being continuous to said other end of said power source line;

ground connecting patterns which are formed on the first layer of said circuit board so as to be separated by said power source line and said spiral circuit pattern element;

a lead line which is formed on a second layer of said circuit board so as to correspond to said power source line and said spiral circuit pattern element;

through holes for electrically connecting the discontinuous portion between the inner side edge portion of said spiral circuit pattern element and said one end of said power source line through said lead line; and connecting means for electrically connecting said separate ground connecting patterns.

2. A board according to claim 1, wherein said electrical connecting means is an electric part of a surface installing type for electrically connecting said separate ground connecting patterns so as to stride over said spiral circuit pattern element.

3. A board according to claim 2, wherein said electric part of the surface installing type is a chip jumper which is installed on lands provided on said separate ground connecting patterns.

4. A board according to claim 1, wherein said electrical connecting means is an electric part of a leading type and is inserted and installed into a hole formed in each said ground connecting pattern.

5. A board according to claim 1, wherein said electrical connecting means is a conductor film for electrically connecting said separate ground connecting patterns so as to stride over said spiral circuit pattern element.

6. A printed circuit board comprising:

a power source line which is formed on a first layer of the circuit board;

a spiral circuit pattern element which is formed between one end and the other end of said power source line on the first layer of the circuit board;

a circuit line of said spiral circuit pattern element being constructed by a plurality of parallel major sides and a plurality of minor sides connecting said major sides, an inner side edge portion of said circuit line forming the major sides and being discontinuous to the one end of said power source line, and an outer side edge portion being continuous to the other end of said power source line;

ground connecting patterns which are formed on the first layer of said circuit board so as to be separated by said power source line and said spiral circuit pattern element;

a lead line which is formed on a second layer of said circuit board so as to correspond to said power source line and said spiral circuit pattern element;

a plurality of through holes for electrically connecting the discontinuous portion between the inner side edge portion of said spiral circuit pattern element and said one end of said power source line through said lead line; and connecting means for electrically connecting said separate ground connecting patterns.

7. A board according to claim 6, wherein in the circuit line of said spiral circuit pattern element, one of said minor side connecting one of said major sides has a straight line shape which almost perpendicularly crosses said one major side.

8. A board according to claim 6, wherein in the circuit line of said spiral circuit pattern element, said one of minor side connecting one of said major sides has a semicircular shape.

9. A board according to claim 6, wherein in the circuit line of said spiral circuit pattern element, one of said minor side connecting one of said major sides is formed by a rectilinear minor side in the direction that is almost perpendicular to said one major side, and a straight line which connects an edge of said one major side and an edge of said rectilinear minor side in a obliquely crossing fashion.

10. A board according to claim 6, wherein a whole width of said spiral circuit pattern element is equal to or less than ½ of a whole length of said circuit line of said spiral circuit pattern element.

11. A printed circuit board comprising:

a power source line which is formed on a first layer of the circuit board;

a spiral pattern element inductor which is formed on the first layer of said circuit board and is formed on said power source line;

first ground connecting patterns which are formed on the first layer of the circuit board and are separated by said power source line and said spiral pattern element inductor;

a lead line which is formed on a second layer of the circuit board of portions corresponding to said power source line and said spiral pattern element inductor;

a second ground connecting pattern which is formed on the second layer of the circuit board of portions excluding at least said lead line;

a first through hole for connecting said spiral pattern element inductor and said power source line through said lead line; and a second through hole for connecting said separate first ground connecting patterns through said second ground connecting pattern.

12. A printed circuit board comprising:

a first circuit pattern which is formed on a first layer of the circuit board, said first circuit pattern having (a) a power source line, (b) a spiral pattern element inductor which is formed on said power source line, (c) a first ground connecting pattern, (d) a second ground connecting pattern which is separated from said first ground connecting pattern by said power source line and said spiral pattern element inductor;

a second circuit pattern which is formed on a second layer of the circuit board, said second circuit pattern having (e) a lead line which is formed in portions corresponding to said power source line and said spiral pattern element inductor, and (f) a third ground connecting pattern which is formed in a portion excluding at least said lead line;

a first through hole for connecting said spiral pattern element inductor and said lead line;

a second through hole for connecting said lead line and said power source line;

a third through hole for connecting said third ground connecting pattern and said first ground connecting pattern; and a fourth through hole for connecting said third ground connecting pattern and said second ground connecting pattern.

* * * * *